(12) United States Patent
Yoshihara et al.

(10) Patent No.: US 7,476,449 B2
(45) Date of Patent: *Jan. 13, 2009

(54) ELECTROMAGNETIC SHIELDING COPPER FOIL, METHOD OF PRODUCTION THEREOF AND ELECTROMAGNETIC SHIELD

(75) Inventors: Yasuhisa Yoshihara, Tochigi (JP); Hisao Kimijima, Tochigi (JP)

(73) Assignee: Furukawa Circuit Foil Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/785,973

(22) Filed: Feb. 26, 2004

(65) Prior Publication Data

US 2004/0170857 A1 Sep. 2, 2004

(30) Foreign Application Priority Data

Feb. 27, 2003 (JP) ............................... 2003-050987
Nov. 11, 2003 (JP) ............................... 2003-381398

(51) Int. Cl.
*B32B 15/16* (2006.01)
*H05K 9/00* (2006.01)

(52) U.S. Cl. ..................... 428/557; 428/607; 428/626; 428/675; 174/388

(58) Field of Classification Search .................. None
See application file for complete search history.

(56) References Cited

U.S. PATENT DOCUMENTS

| | | | | |
|---|---|---|---|---|
| 4,456,508 A | * | 6/1984 | Torday et al. | 428/612 |
| 4,549,940 A | * | 10/1985 | Karwan | 205/50 |
| 5,066,692 A | * | 11/1991 | Isawa et al. | 523/458 |
| 5,366,814 A | * | 11/1994 | Yamanishi et al. | 428/607 |
| 5,679,230 A | * | 10/1997 | Fatcheric et al. | 205/50 |
| 5,779,870 A | * | 7/1998 | Seip | 205/77 |
| 5,800,930 A | * | 9/1998 | Chen et al. | 428/607 |
| 6,143,674 A | * | 11/2000 | Marutsuka | 442/8 |
| 6,548,153 B2 | * | 4/2003 | Kataoka et al. | 428/209 |
| 6,939,622 B2 | * | 9/2005 | Yoshihara et al. | 428/675 |
| 2001/0014406 A1 | * | 8/2001 | Mitsuhashi et al. | 428/606 |
| 2002/0011418 A1 | * | 1/2002 | Manabe et al. | 205/191 |
| 2002/0182432 A1 | * | 12/2002 | Sakamoto et al. | 428/553 |
| 2002/0182433 A1 | * | 12/2002 | Endo | 428/606 |
| 2004/0043242 A1 | * | 3/2004 | Nakaoka et al. | 428/553 |

FOREIGN PATENT DOCUMENTS

| | | | |
|---|---|---|---|
| EP | 0 709 494 A2 | | 5/1996 |
| EP | 1 394 291 A2 | | 3/2004 |
| JP | 54-114782 | * | 9/1979 |
| JP | 01-163059 | * | 6/1989 |
| JP | 07-202367 | * | 8/1995 |
| JP | 09-087889 | | 3/1997 |
| JP | 11-256389 | | 9/1999 |
| JP | 2002-198686 | * | 7/2002 |
| JP | 2003-201597 | | 7/2003 |
| WO | WO 2004/039137 A1 | | 5/2004 |

OTHER PUBLICATIONS

European Search Report, Dated Dec. 21, 2005.

* cited by examiner

*Primary Examiner*—John J Zimmerman
(74) *Attorney, Agent, or Firm*—Rader Fishman & Grauer PLLC; Ronald P. Kananen

(57) ABSTRACT

An electromagnetic shielding copper foil superior in electromagnetic shielding ability, high in transmittance, and free from particle shedding comprising a copper foil on at least one surface of which a fine roughening particle layer of copper or an alloy is provided and having on the fine roughening particle layer a smoothening layer comprised of cobalt, nickel, indium, or an alloy of the same and an electromagnetic shield able to be suitably used for a PDP using the same. The fine roughening particle layer may also be a layer comprised of a fine particle roughening particle layer of copper on which a fine roughening particle layer of a copper alloy is stacked or may also be formed by a copper-cobalt-nickel alloy. The smoothening layer of the copper foil may be treated for stain-proof or by a silane coupling agent to protect the surface of the copper foil.

12 Claims, No Drawings

ELECTROMAGNETIC SHIELDING COPPER FOIL, METHOD OF PRODUCTION THEREOF AND ELECTROMAGNETIC SHIELD

BACKGROUND OF THE INVENTION

1. Field of the Invention

The present invention mainly relates to copper foil suitable for electromagnetic shielding of a display, more particularly relates to a copper foil used as a material for making an electromagnetic shield suitable for a plasma display panel (PDP), a method of production of the same, and an electromagnetic shield made by that copper foil.

2. Description of the Related Art

Optoelectronic components and other electronic equipment are becoming remarkably more sophisticated and advanced. In particular, optoelectronic image displays are rapidly spreading in use for television receivers, computer monitors, etc. In recent years, in particular, market demand has been rising for the new large flat screen displays. Recently, large flat screen PDPs have come into the spotlight.

PDPs, however, in principle emit strong electromagnetic waves. Electromagnetic waves are liable to interfere with various instruments and may have an effect on human health as well. Recently, legal regulations regarding emission of electromagnetic waves have therefore become tougher. For example, there are the U.S. Voluntary Control Council for Interference by Data Processing Equipment: Electronic Office Machines (VCCI) of the Federal Communication Commission (FCC), the Japanese Electrical Appliance and Material Control Law, and other product regulations.

An electromagnetic shield has to be conductive over the entire surface and be superior in transparency. To meet these requirements, in practice, a transparent conductive thin film is sometimes provided over the entire surface of a PDP as an electromagnetic shield. Such a PDP, however, ends up with reduced transmittance of the transparent conductive layer itself if trying to obtain an electromagnetic shielding ability of for example at least 60 dB.

To solve this problem, the method has been proposed of inserting fine metal wires woven into a mesh between films or glass or polymer substrates to form an electromagnetic shield. However, a weave of fine metal wires easily becomes twisted and if combined with a PDP, problems in appearance such as moire patterns occur.

Therefore, further, the method has been proposed of bonding metal foil, particularly copper foil, to a transparent polymer film using an adhesive, then forming a mesh pattern in the metal foil by etching. The metal parts, however, are substantially opaque, so raising the transmittance was a difficult problem.

On the other hand, in recent years, when processing metal foil into electromagnetic shields, shedding of particles from the metal foil and uneven color of the surface of the metal foil have come to be viewed as problems.

Research is also proceeding on the particle shedding from copper foil and the electroforming solutions eliminating toxic substances. Copper foil for printed circuit boards was previously disclosed by the assignee in Japanese Unexamined Patent Publication (Kokai) No. 11-256389. With the technology disclosed in Japanese Unexamined Patent Publication (Kokai) No. 11-256389, however, the hue or evenness of color required for an electromagnetic shield and measures against particle shedding cannot be said to be sufficient.

SUMMARY OF THE INVENTION

An object of the present invention is to provide a copper foil suitable for electromagnetic shielding having a blackened surface with a uniform hue and no uneven color, free from shedding of powder, superior in electromagnetic shielding ability, and high in transmittance.

Another object of the present invention is to provide a copper foil superior as a material for fabricating an electromagnetic shield for a PDP, a method of production of the same, and an electromagnetic shield able to be used for a PDP fabricated by that copper foil.

According to a first aspect of the present invention, there is provided an electromagnetic shielding copper foil comprising a copper foil or a copper alloy foil on at least one surface of which a fine roughening particle layer comprising fine roughening particles is provided.

The fine roughening particles preferably comprise copper, copper-cobalt, cobalt-nickel or copper-cobalt-nickel alloy, or comprise a copper alloy containing at least one of selenium, antimony, tungsten, tellurium, bismuth, molybdenum and iron.

The fine roughening particle layer preferably comprises a first fine roughening particle layer comprising fine roughening particles of copper, copper-cobalt, cobalt-nickel or copper-cobalt-nickel, on which a second fine roughening particle layer comprising fine roughening particles of a copper alloy is stacked. The second fine roughening particle layer may comprise a copper alloy containing at least one of selenium, antimony, tungsten, tellurium, bismuth, molybdenum and iron.

According to a second aspect of the invention, there is provided an electromagnetic shielding copper foil S comprising a copper foil or copper alloy foil on at least one surface of which is provided a fine roughening particle layer on which a smoothening layer comprising cobalt, nickel, indium or an alloy of the same.

The electromagnetic shielding copper foil is preferably configured so that at least one surface of the copper foil or the copper alloy foil is provided with a first fine roughening particle layer comprising copper, copper-cobalt, cobalt-nickel or copper-cobalt-nickel, on which a second fine roughening particle layer comprising copper-cobalt, cobalt-nickel or copper-cobalt-nickel is provided, on which a smoothening layer comprising cobalt, nickel, indium or an alloy of the same is provided.

Preferably, the smoothening layer may be a cobalt alloy with a copper content of not more than 5%.

The surface roughness Rz of the copper foil or the copper alloy foil is preferably not more than 3 μm. The surface roughness Rz of the smoothening layer is not more than 3.5 μm.

Preferably, the fine roughening particle layer or the smoothening layer is treated for stainproof or by a silane coupling agent.

According to a third aspect of the invention, there is provided a method of production of an electromagnetic shielding copper foil comprising providing on a least one surface of a copper foil or a copper alloy foil a first fine roughening particle layer comprising copper, copper-cobalt, cobalt-nickel or copper-cobalt-nickel, providing on the first fine roughening particle layer a second fine roughening particle layer comprising copper-cobalt, cobalt-nickel or copper-cobalt-nickel, and providing on the second fine roughening particle layer a smoothening layer comprising cobalt, nickel, indium or an alloy of the same.

The fine roughening particle layer is preferably formed by plating in a sulfuric acid bath, while the smoothening layer is formed by plating by a plating bath having a copper content of not more than 300 ppm.

According to a fourth aspect of the present invention, there is provided an electromagnetic shield produced by an electromagnetic shielding copper foil of the present invention.

DESCRIPTION OF THE PREFERRED EMBODIMENTS

Preferred embodiments of the present invention will be described in detail below while referring to the attached figures.

For the electromagnetic shielding copper foil of the present embodiment, a rolled copper foil or electrodeposited copper foil is mainly used. The electromagnetic shielding copper foil of the present embodiment is an electrodeposited copper foil or rolled copper foil on one surface of which a fine roughening particle layer is provided. The fine roughening particle layer is preferably obtained by providing one to several layers of fine roughening particles of copper, a copper alloy or a cobalt-nickel alloy, or further by adjusting the electroplating treatment time or current density so as to adjust the thickness, then providing one to several smoothening layers having cobalt, nickel, indium or an alloy of the same on the fine roughening particle layer, or further by adjusting the electroforming treatment time or current density so as to adjust the thickness.

The fine roughening particle layer having the fine roughening particles of copper or a copper alloy is provided on the surface of the copper foil because giving the surface of the copper foil the layer of fine particles facilitates random reflection of the surface and lowers the reflectance.

Note that by forming the fine roughening particle layer by copper, a copper-cobalt alloy, a copper-nickel alloy, a cobalt-nickel alloy or a copper-cobalt-nickel alloy (hereinafter referred to simply as "copper or an alloy"), the copper or the alloy facilitates the formation of the fine roughening particles and enables the formation of the surface of the fine roughening particle layer with the fine roughening particles evenly distributed.

The outer layer of the fine roughening particle layer is provided with a smoothening layer in accordance with need. The smoothening layer is provided so as to effectively prevent the fine roughening particles of the layer formed on the surface of the copper foil from dropping off when touching objects etc. in the processing of the later steps, i.e., so-called "particle shedding".

In the electromagnetic shielding copper foil of the present embodiment, the brightness (the reflectance) which is influent to shielding property and the particle shedding have a relation with the thickness of the smoothening layer. That is, when the thickness of the smoothening layer becomes thicker, the brightness becomes higher and the particle shedding becomes less, and on the contrary, when the thickness of the smoothening layer becomes thinner, the brightness becomes lower and the particle shedding becomes more.

The thickness of the fine roughening particle layer having the copper or the alloy is related with the shade needed as the electromagnetic shield. That is, when a dark black color is needed, it is preferable that the number of deposition layers of the fine roughening particles may be increased or electroplating time may be elongated (thickness made thicker), and when a light black color is needed, it is preferable that the number may be one to three or so, or the electroplating time may be shortened (thickness made thinner). Further, the smoothening layer provided on the fine roughening layer in accordance with need is influent to the shade of black of the surface of the copper foil. Therefore, the number of smoothening layers or the electroplating time (thickness) is selected optionally in accordance with the shade of black to deposit at the thickness according to the need for the shade of black, but the influence to the brightness is not negligible.

In the electromagnetic shielding copper foil provided with the smoothening layer of the present embodiment, at least one surface of the copper foil is provided directly with a fine roughening particle layer. Depending on the roughness of the surface of the copper foil, however, it is also possible to provide a first fine roughening particle layer by plating the surface of the copper film with copper or an alloy and provide that with a second fine roughening particle layer having a copper-cobalt alloy, copper-nickel alloy, cobalt-nickel alloy or copper-cobalt-nickel alloy. It is preferable that the first fine roughening particle layer is used to make the surface roughness Rz of the surface of the copper foil not more than 3 μm.

That is, the copper foil is first provided with a first fine roughening particle layer by copper or alloy plating. This is because of the following: This first fine roughening particle layer makes the roughness of the surface of the copper foil constant. Further, first, it promises the effect of darkening the shade of black even if the second fine roughening particle layer provided on top is thin. Second, since it is possible to darken the shade of black by providing the first fine roughening particle layer, it is possible to reduce the thickness of the second fine roughening particle layer. In addition, since the first fine roughening particle layer is made of a metal similar to the copper foil, the bond strength of the two is strong and therefore the second fine roughening particle layer having copper-cobalt alloy, copper-nickel alloy, cobalt-nickel alloy or copper-cobalt-nickel alloy provided on the same can be made thinner. Therefore, the particle shedding phenomenon becomes rarer, and the smoothening layer can be omitted or made thinner.

Further, the fine roughening particle layer or smoothening layer may be provided with various surface treatments, for example, chromate treatment, pickling treatment, zinc chromate treatment, or other stainproof treatment, silane coupling agent treatment, etc.

The thickness of the copper foil is preferably 3 μm to 30 μm, more preferably 5 to 20 μm, still more preferably 7 to 12 μm. If more than this thickness, time is required for etching, while if less than this thickness, handling of the copper foil becomes extremely difficult.

The aperture rate of the light transmitting parts when using copper foil for electromagnetic shielding is preferably 60% to 97%, more preferably at least 70%. The larger the aperture rate, the better. The shapes of the apertures are not particularly limited, but may be equilateral triangles, squares, equilateral hexagons, circles, rectangles, diamonds, etc. Shapes uniformly arrayed in the plane are preferred. The typical size of apertures of the light transmitting parts is in the range of a side or diameter of 100 to 300 μm. If the value is too large, the electromagnetic shielding ability falls, while if too small, undesirable effects are given to the image on the display.

The width of the copper foil at the parts other than the apertures is preferably 5 to 50 μm. That is, the pitch is preferably 100 to 350 μm. If less than this width, etching is extremely difficult. If greater than this width, an undesirable effect is given to the image.

The actual sheet resistance of copper foil having a light transmitting parts can be measured by the four-terminal method with an electrode distance of at least five times the repeating units of the pattern. For example, if the apertures are shaped as squares with 100 μm sides and the squares are regularly arranged separated by widths of the metal layer of 20 μm, it is possible to measure the resistance by 1 mm diameter electrodes at a 1 mm distance. Alternatively, if processing the film formed with the patterns into strips, providing electrodes at the two ends in the longitudinal direction, measuring the resistance (R), and designating the length in the long direction as a and the length in the short direction as b, the actual sheet resistance can be found by Resistance=R× b/a. The value measured in this way is preferably 0.005 Ω/□ to 0.5 Ω/□, more preferably 0.01 Ω/□ to 0.3 Ω/□. If trying to obtain a value smaller than this, the thickness becomes too small and the apertures cannot be sufficiently obtained. On the other hand, if the value is larger than this, it is no longer possible to obtain a sufficient electromagnetic shielding ability.

As the resin substrate to be bonded to the electromagnetic shielding copper foil of the present embodiment, a transparent polymer film having a suitable heat resistance and transparency is preferable. A transparent polymer film having a heat resistance of a glass transition temperature of at least 40° C. and a transparency of a transmittance of light of 550 nm of at least 80% is preferable.

As the transparent polymer film, polysulfone (PSF), polyether sulfone (PES), polyethylene terephthalate (PET), polymethylene methacrylate (PMMA), polycarbonate (PC), polyether ether ketone (PEEK), polypropylene (PP), triacetyl cellulose (TAC), etc. may be mentioned.

As the method for laminating the electromagnetic shielding copper foil of the present embodiment to a resin substrate, it is possible to coat an acrylic-based, epoxy-based, urethane-based, silicone-based, polyester-based, or other transparent adhesive on a polymer film, then laminate this with the copper foil. Alternatively, it is possible to coat the copper foil with an adhesive and laminate the two.

As the method for forming the light transmitting parts at the electromagnetic shielding copper foil, the printing method or photoresist method is used. With the printing method, a mask layer is screen printed by a printing resist material to form patterns. With the method of using a photoresist material, a photoresist material is formed on a metal foil by roll coating, spin coating, full surface printing, transfer, etc., is exposed and developed using a photomask, and is patterned. After the resist finishes being patterned, the copper foil parts of the apertures are etched away to provide a copper foil layer having light transmitting parts of the desired aperture shapes and aperture rate.

The surface light reflectance of the electromagnetic shielding copper foil is preferably 1% to 50%. This is because when using the electromagnetic shielding copper foil as a light transmitting electromagnetic shield, the reflectance of light will obstruct the viewing ability. The reflectance is generally an average reflectance of 400 nm to 600 nm, but the reflectance here is not wavelength dependent and is determined representatively by the reflectance of light of a wavelength of 550 nm.

The smoothening layer provided in accordance with need for preventing particle shedding is formed by smoothening plating of cobalt, nickel, indium or an alloy of the same. The reflectance of the electromagnetic shielding copper foil is governed by the thicknesses of the fine roughening particle layer and smoothening layer. The number of the smoothening layers (thickness) for obtaining a reflectance of 1% to 50% does not have to be large (thick), but a suitable range is 5 nm to 100 nm. If thinner than this, particle shedding cannot be prevented. If a thickness greater than this, the reflectance becomes high and the material is wasted.

The surface of the side of the copper foil where no smoothening layer is provided is preferably blackened as treatment for preventing reflection to obtain copper foil blackened on both surfaces. The antireflection effect can be similarly achieved by providing a fine roughening particle layer of copper, cobalt, nickel or an alloy of the same etc. or by providing a black layer by a usual blackening method.

Next, the present invention will be explained in detail with reference to examples. Note that the present invention is however not limited to these examples.

EXAMPLE 1

One surface of an untreated electrodeposited copper foil of a thickness of 12 μm is first provided with a first fine roughening particle layer having fine roughening particles of copper by copper plating.

| Plating Conditions of Fine Roughening Particle Layer | |
| --- | --- |
| Plating bath composition | |
| Copper sulfate (as Cu metal): | 5.3 g/liter |
| Sulfuric acid: | 42 g/liter |
| Arsenic: | 240 ppm |
| Plating conditions | |
| Temperature: | 18° C. |
| Current density: | 18 A/dm$^2$ |
| Treatment time: | 6 seconds |

The amount of deposition of the fine roughening particles on the copper foil by plating under the above conditions was 9.9 mg/cm$^2$.

Next, the surface of the first fine roughening particle layer is plated with a second fine roughening particle layer having Cu—Co—Ni under the following conditions and further plated over that with a smoothening layer made of cobalt metal by smoothening cover plating:

| Plating Conditions of Second Fine Roughening Particle Layer | |
| --- | --- |
| Plating bath composition | |
| Copper sulfate (as Cu metal): | 2 g/liter |
| Cobalt sulfate (as Co metal): | 8 g/liter |
| Nickel sulfate (as Ni metal): | 8 g/liter |
| Ammonium sulfate: | 40 g/liter |
| Boric acid: | 20 g/liter |
| pH: | 3.5 |
| Plating conditions | |
| Temperature: | 30° C. |
| Current density: | 15 A/dm$^2$ |
| Treatment time: | 3 seconds |

The composition of the second fine roughening particle layer plated under the above conditions was analyzed and found as a result to be, as actual composition mg/dm$^2$ foil, Cu: 3.3, Co: 6.3, Ni: 1.6.

| Plating Conditions of Smoothening Layer | |
| --- | --- |
| Plating bath composition | |
| Cobalt sulfate (as Co metal): | 10 g/liter |
| Boric acid: | 20 g/liter |
| Ammonium sulfate: | 40 g/liter |
| pH: | 2.5 |
| Plating conditions | |
| Temperature: | 50° C. |
| Current density: | 5.6 A/dm$^2$ |
| Treatment time: | 10 seconds |

The smoothening layer plated by the above conditions had cobalt in an amount of 11.7 mg/dm$^2$.

EXAMPLE 2

One surface of an untreated electrodeposited copper foil of a thickness of 12 μm is provided with a first fine roughening particle layer by copper plating, the first fine roughening particle layer is provided with a second fine roughening particle layer having copper-cobalt, and this is formed with a smoothening layer having cobalt under the same conditions as in Example 1.

| Plating Conditions of First Fine Roughening Particle Layer | |
| --- | --- |
| Plating bath composition | |
| Copper sulfate (as Cu metal): | 5.3 g/liter |
| Sulfuric acid: | 42 g/liter |
| Arsenic: | 240 ppm |
| Plating conditions | |
| Temperature: | 18° C. |
| Current density: | 18 A/dm$^2$ |
| Treatment time: | 6 seconds |

The amount of deposition of the fine roughening particles on the copper foil by plating under the above conditions was 9.9 mg/cm$^2$.

| Plating Conditions of Second Fine Roughening Particle Layer | |
| --- | --- |
| Plating bath composition | |
| Copper sulfate (as Cu metal): | 1 g/liter |
| Cobalt sulfate (as Co metal): | 8 g/liter |
| Ammonium sulfate: | 40 g/liter |
| Boric acid: | 20 g/liter |
| pH: | 3.5 |
| Plating conditions | |
| Temperature: | 40° C. |
| Current density: | 15 A/dm$^2$ |
| Treatment time: | 3 seconds |

The composition of the second fine roughening particle layer plated under the above conditions was analyzed and found as a result to be, as actual composition mg/dm$^2$ foil, Cu: 3.2 and Co: 6.4.

EXAMPLE 3

One surface of a rolled copper foil of a thickness of 12 μm is plated with a fine roughening particle layer having copper-cobalt and plated over that with a smoothening layer having cobalt under the same conditions as in Example 1.

| Plating Conditions of Fine Roughening Particle Layer | |
| --- | --- |
| Plating bath composition | |
| Copper sulfate (as Cu metal): | 1 g/liter |
| Cobalt sulfate (as Co metal): | 8 g/liter |
| Ammonium sulfate: | 40 g/liter |
| Boric acid: | 20 g/liter |
| pH: | 3.5 |
| Plating conditions | |
| Temperature: | 40° C. |
| Current density: | 15 A/dm$^2$ |
| Treatment time: | 4 seconds |

The composition of the fine roughening particle layer plated under the above conditions was analyzed and found as a result to be, as actual composition mg/dm$^2$ foil, Cu: 4.2 and Co: 8.3.

EXAMPLE 4

One surface of an electrodeposited copper foil of a thickness of 12 μm is provided with a first fine roughening particle layer by copper plating, the first fine roughening particle layer is provided with a second fine roughening particle layer having copper-cobalt, and this is formed with a smoothening layer having cobalt under the same conditions as in Example 1.

| Plating Conditions of First Fine Roughening Particle Layer | |
| --- | --- |
| Plating bath composition | |
| Copper sulfate (as Cu metal): | 5.3 g/liter |
| Sulfuric acid: | 42 g/liter |
| Arsenic: | 240 ppm |
| Plating conditions | |
| Temperature: | 18° C. |
| Current density: | 18 A/dm$^2$ |
| Treatment time: | 6 seconds |

The amount of deposition of the fine roughening particles on the copper foil by plating under the above conditions was 9.9 mg/cm$^2$.

| Plating Conditions of Second Fine Roughening Particle Layer | |
| --- | --- |
| Plating bath composition | |
| Cobalt sulfate (as Co metal): | 8 g/liter |
| Nickel sulfate (as Ni metal): | 1 g/liter |
| Ammonium sulfate: | 40 g/liter |

-continued

| Plating Conditions of Second Fine Roughening Particle Layer | |
| --- | --- |
| Boric acid: | 20 g/liter |
| pH: | 3.5 |
| Plating conditions | |
| Temperature: | 40° C. |
| Current density: | 30 A/dm$^2$ |
| Treatment time: | 3 seconds |

The composition of the second fine roughening particle layer plated under the above conditions was analyzed and found as a result to be, as actual composition mg/dm$^2$ foil, Co: 9.5 and Ni: 1.1.

EXAMPLE 5

One surface of an electrodeposited copper foil of a thickness of 10 μm is first provided with a fine roughening particle layer by copper plating, then the fine roughening particle layer is plated with a smoothening layer having cobalt.

| Plating Conditions of First Fine Roughening Particle Layer | |
| --- | --- |
| Plating bath composition | |
| Copper (as metal): | 15 g/liter |
| Sulfuric acid: | 160 g/liter |
| Sodium selenite: | 0.015 g/liter |
| Plating conditions | |
| Temperature: | 20° C. |
| Current density: | 20 A/dm$^2$ |
| Treatment time: | 1.5 seconds |

The amount of deposition of the fine roughening particles on the copper foil by plating under the above conditions was 5.4 mg/cm$^2$.

| Plating Conditions of Smoothening Layer | |
| --- | --- |
| Plating bath composition | |
| Cobalt sulfate (as Co metal): | 10 g/liter |
| Ammonium sulfate: | 40 g/liter |
| Boric acid: | 20 g/liter |
| Plating conditions | |
| Temperature: | 50° C. |
| Current density: | 6 A/dm$^2$ |
| Treatment time: | 30 seconds |

The amount of deposition of the smoothening layer on the fine roughening particle layer by plating by the above conditions was 37 mg/dm$^2$.

EXAMPLE 6

One surface of an electrodeposited copper foil of a thickness of 10 μm is first provided with a fine roughening particle layer by copper plating, then the fine roughening particle layer is plated with a smoothening layer having indium.

| Plating Conditions of Fine Roughening Particle Layer | |
| --- | --- |
| Plating bath composition | |
| Copper (as metal): | 15 g/liter |
| Iron (as metal): | 4 g/liter |
| Molybdenum (as metal): | 0.3 g/liter |
| Tungsten (as metal): | 0.3 ppm |
| Sulfuric acid: | 160 g/liter |
| Plating conditions | |
| Temperature: | 20° C. |
| Current density: | 50 A/dm$^2$ |
| Treatment time: | 4.5 seconds |

The amount of deposition of the fine roughening particles on the copper foil by plating under the above conditions was 21.1 mg/cm$^2$.

| Plating Conditions of Smoothening Layer | |
| --- | --- |
| Plating bath composition | |
| Indium (as metal): | 8 g/liter |
| Ammonium sulfate: | 40 g/liter |
| Boric acid: | 20 g/liter |
| pH: | 2.5 |
| Plating conditions | |
| Temperature: | 40° C. |
| Current density: | 3 A/dm$^2$ |
| Treatment time: | 15 seconds |

The amount of deposition of the smoothening layer on the fine roughening particle layer by plating by the above conditions was 9.5 mg/dm$^2$.

EXAMPLE 7

One surface of an electrodeposited copper foil of a thickness of 10 μm is first provided with a first fine roughening particle layer by copper plating, then the first fine roughening particle layer is provided with a second fine roughening particle layer having a copper alloy.

| Plating Conditions of First Fine Roughening Particle Layer | |
| --- | --- |
| Plating bath composition | |
| Copper (as metal): | 65 g/liter |
| Sulfuric acid: | 120 g/liter |
| Plating conditions | |
| Temperature: | 50° C. |
| Current density: | 65 A/dm$^2$ |
| Treatment time: | 1.2 seconds |

The amount of deposition of the fine roughening particles on the copper foil by plating under the above conditions was 218.8 mg/cm$^2$.

Plating Conditions of Second Fine Roughening Particle Layer

Plating bath composition

| | |
|---|---|
| Copper (as metal): | 1 g/liter |
| Cobalt (as metal): | 8 g/liter |
| Ammonium sulfate: | 40 g/liter |
| Boric acid: | 20 g/liter |
| pH: | 3.8 |

Plating conditions

| | |
|---|---|
| Temperature: | 40° C. |
| Current density: | 15 A/dm$^2$ |
| Treatment time: | 3 seconds |

The composition of the second fine roughening particle layer plated under the above conditions was, as actual composition mg/dm$^2$ foil, Cu: 3.5 and Co: 5.0.

Next, the second fine roughening particle layer was formed with a smoothening layer having cobalt under the following plating conditions:

Plating Conditions of Smoothening Layer

Plating bath composition

| | |
|---|---|
| Cobalt (as metal): | 10 g/liter |
| Ammonium sulfate: | 40 g/liter |
| Boric acid: | 20 g/liter |
| pH: | 2.5 |

Plating conditions

| | |
|---|---|
| Temperature: | 40° C. |
| Current density: | 3 A/dm$^2$ |
| Treatment time: | 30 seconds |

The amount of deposition of the smoothening layer plated by the above conditions on the second fine roughening particle layer was 24.2 mg/dm$^2$.

EXAMPLE 8

One surface of an electrodeposited copper foil of a thickness of 10 μm is first provided with a first fine roughening particle layer by copper plating, then the first fine roughening particle layer is provided with a second fine roughening particle layer having a copper alloy.

Plating Conditions of First Fine Roughening Particle Layer

Plating bath composition

| | |
|---|---|
| Copper (as metal): | 65 g/liter |
| Sulfuric acid: | 120 g/liter |

Plating conditions

| | |
|---|---|
| Temperature: | 50° C. |
| Current density: | 65 A/dm$^2$ |
| Treatment time: | 1.2 seconds |

The amount of deposition of the fine roughening particles on the copper foil by plating under the above conditions was 218.8 mg/cm$^2$.

Plating Conditions of Second Fine Roughening Particle Layer

Plating bath composition

| | |
|---|---|
| Copper (as metal): | 10 g/liter |
| Iron (as metal): | 4 g/liter |
| Molybdenum (as metal): | 0.3 g/liter |
| Tungsten (as metal): | 0.3 ppm |
| pH: | 2.5 |

Plating conditions

| | |
|---|---|
| Temperature: | 20° C. |
| Current density: | 50 A/dm$^2$ |
| Treatment time: | 1.2 seconds |

The amount of deposition of the fine roughening particles on the copper foil by plating under the above conditions was 5.6 mg/cm$^2$.

Next, the second fine roughening particle layer was formed with a smoothening layer having cobalt under the following plating conditions:

Plating Conditions of Smoothening Layer

Plating bath composition

| | |
|---|---|
| Cobalt (as metal): | 10 g/liter |
| Ammonium sulfate: | 40 g/liter |
| Boric acid: | 20 g/liter |
| pH: | 2.5 |

Plating conditions

| | |
|---|---|
| Temperature: | 40° C. |
| Current density: | 3 A/dm$^2$ |
| Treatment time: | 30 seconds |

The amount of deposition of the smoothening layer on the second fine roughening particle layer by plating by the above conditions was 24.2 mg/dm$^2$.

EXAMPLE 9

One surface of an electrodeposited copper foil of a thickness of 12 μm is first provided with a fine roughening particle layer by copper plating, then the first fine roughening particle layer is provided with a smoothening layer having cobalt.

Plating Conditions of Fine Roughening Particle Layer

Plating bath composition

| | |
|---|---|
| Copper (as metal): | 2 g/liter |
| Cobalt (as metal): | 8 g/liter |
| Nickel (as metal): | 8 g/liter |
| Ammonium sulfate: | 40 g/liter |
| Sulfuric acid: | 20 g/liter |
| pH: | 3.5 to 4.0 |

Plating conditions

| | |
|---|---|
| Temperature: | 40° C. |
| Current density: | 40 A/dm$^2$ |
| Treatment time: | 2.4 seconds |

The composition of the fine roughening particle layer plated under the above conditions was analyzed and found as a result to be, as actual composition mg/dm$^2$ foil, Cu: 4.7, Co: 9.56, and Ni: 8.4.

| Plating Conditions of Smoothening Layer | |
|---|---|
| Plating bath composition | |
| Cobalt (as metal): | 10 g/liter |
| Ammonium sulfate: | 40 g/liter |
| Boric acid: | 20 g/liter |
| Plating conditions | |
| Temperature: | 50° C. |
| Current density: | 4 A/dm$^2$ |
| Treatment time: | 30 seconds |

The amount of deposition of the smoothening layer on the fine roughening particle layer by plating by the above conditions was 32.2 mg/dm$^2$.

EXAMPLE 10

One surface of an electrodeposited copper foil of a thickness of 12 μm is first provided with a fine roughening particle layer by copper plating, then the fine roughening particle layer is provided with a smoothening layer having cobalt.

| Plating Conditions of Fine Roughening Particle Layer | |
|---|---|
| Plating bath composition | |
| Copper (as metal): | 15 g/liter |
| Sulfuric acid: | 160 g/liter |
| Antimony: | 0.2 g/liter |
| Tungsten: | 4 ppm |
| Plating conditions | |
| Temperature: | 20° C. |
| Current density: | 20 A/dm$^2$ |
| Treatment time: | 2.5 seconds |

The amount of deposition of the fine roughening particles on the copper foil by plating under the above conditions was 9.7 mg/cm$^2$.

| Plating Conditions of Smoothening Layer | |
|---|---|
| Plating bath composition | |
| Cobalt (as metal): | 10 g/liter |
| Ammonium sulfate: | 40 g/liter |
| Boric acid: | 20 g/liter |
| Plating conditions | |
| Temperature: | 50° C. |
| Current density: | 3 A/dm$^2$ |
| Treatment time: | 30 seconds |

The amount of deposition of the smoothening layer on the fine roughening particle layer by plating by the above conditions was 24.2 mg/dm$^2$.

EXAMPLE 11

One surface of an electrodeposited copper foil of a thickness of 12 μm is first provided with a fine roughening particle layer by copper plating, then the fine roughening particle layer is provided with a smoothening layer having cobalt.

| Plating Conditions of Fine Roughening Particle Layer | |
|---|---|
| Plating bath composition | |
| Copper (as metal): | 15 g/liter |
| Sulfuric acid: | 160 g/liter |
| Tellurium: | 0.02 g/liter |
| Plating conditions | |
| Temperature: | 50° C. |
| Current density: | 30 A/dm$^2$ |
| Treatment time: | 2 seconds |

The amount of deposition of the fine roughening particles on the copper foil by plating under the above conditions was 13.1 mg/cm$^2$.

| Plating Conditions of Smoothening Layer | |
|---|---|
| Plating bath composition | |
| Cobalt (as metal): | 10 g/liter |
| Ammonium sulfate: | 40 g/liter |
| Boric acid: | 20 g/liter |
| Plating conditions | |
| Temperature: | 50° C. |
| Current density: | 4 A/dm$^2$ |
| Treatment time: | 30 seconds |

The amount of deposition of the smoothening layer on the fine roughening particle layer by plating by the above conditions was 32.2 mg/dm$^2$.

EXAMPLE 12

One surface of an electrodeposited copper foil of a thickness of 10 μm is first provided with a fine roughening particle layer by copper plating, then the fine roughening particle layer is provided with a smoothening layer having cobalt.

| Plating Conditions of Fine Roughening Particle Layer | |
|---|---|
| Plating bath composition | |
| Copper (as metal): | 15 g/liter |
| Sulfuric acid: | 160 g/liter |
| Bismuth: | 0.02 g/liter |
| Tungsten: | 4 ppm |
| Plating conditions | |
| Temperature: | 50° C. |
| Current density: | 20 A/dm$^2$ |
| Treatment time: | 2 seconds |

The amount of deposition of the fine roughening particles on the copper foil by plating under the above conditions was 13.9 mg/cm$^2$.

| Plating Conditions of Smoothening Layer | |
|---|---|
| Plating bath composition | |
| Cobalt (as metal): | 10 g/liter |
| Ammonium sulfate: | 40 g/liter |
| Boric acid: | 20 g/liter |

-continued

| Plating Conditions of Smoothening Layer | |
| --- | --- |
| Plating conditions | |
| Temperature: | 50° C. |
| Current density: | 4 A/dm² |
| Treatment time: | 30 seconds |

The amount of deposition of the smoothening layer on the fine roughening particle layer by plating by the above conditions was 32.2 mg/dm².

EXAMPLE 13

One surface of an electrolytic copper foil of a thickness of 10 μm is first provided with a fine roughening particle layer by copper plating, then the fine roughening particle layer is provided with a smoothening layer having cobalt and nickel.

| Plating Conditions of Fine Roughening Particle Layer | |
| --- | --- |
| Plating bath composition | |
| Copper (as metal): | 10 g/liter |
| Iron (as metal): | 4 g/liter |
| Molybdenum (as metal): | 0.3 g/liter |
| Tungsten (as metal): | 0.3 ppm |
| Sulfuric acid: | 160 g/liter |
| Plating conditions | |
| Temperature: | 20° C. |
| Current density: | 50 A/dm² |
| Treatment time: | 4.5 seconds |

The amount of deposition of the fine roughening particles on the copper foil by plating under the above conditions was 21.1 mg/cm².

| Plating Conditions of Smoothening Layer | |
| --- | --- |
| Plating bath composition | |
| Cobalt (as metal): | 8 g/liter |
| Nickel (as metal): | 0.5 g/liter |
| Ammonium sulfate: | 40 g/liter |
| Boric acid: | 20 g/liter |
| pH: | 4.5 |
| Plating conditions | |
| Temperature: | 40° C. |
| Current density: | 3 A/dm² |
| Treatment time: | 20 seconds |

The composition of the fine roughening particle layer plated under the above conditions was analyzed and found as a result to be, as actual composition mg/dm² foil, Co: 20.1 and Ni: 0.42.

EXAMPLE 14

One surface of an electrodeposited copper foil of a thickness of 10 μm is first provided with a fine roughening particle layer by copper plating, then the fine roughening particle layer is provided with a smoothening layer having copper and cobalt.

| Plating Conditions of Fine Roughening Particle Layer | |
| --- | --- |
| Plating bath composition | |
| Copper (as metal): | 10 g/liter |
| Iron (as metal): | 4 g/liter |
| Molybdenum (as metal): | 0.3 g/liter |
| Tungsten (as metal): | 0.3 ppm |
| Sulfuric acid: | 160 g/liter |
| Plating conditions | |
| Temperature: | 20° C. |
| Current density: | 50 A/dm² |
| Treatment time: | 4.5 seconds |

The amount of deposition of the fine roughening particles on the copper foil by plating under the above conditions was 21.1 mg/cm².

| Plating Conditions of Smoothening Layer | |
| --- | --- |
| Plating bath composition | |
| Cobalt (as metal): | 8 g/liter |
| Copper (as metal): | 0.5 g/liter |
| Ammonium sulfate: | 40 g/liter |
| Boric acid: | 20 g/liter |
| pH: | 4.5 |
| Plating conditions | |
| Temperature: | 40° C. |
| Current density: | 3 A/dm² |
| Treatment time: | 20 seconds |

The composition of the fine roughening particle layer plated under the above conditions was, as actual composition mg/dm² foil, Co: 18.2 and Cu: 0.61.

The smoothening layer of the copper foil prepared in each of Examples 1 to 14 was treated for stainproof and/or by a silane coupling agent as required. The method of treatment for stainproof or treatment by a silane coupling agent was a conventionally generally used treatment method.

COMPARATIVE EXAMPLES 1, 2, AND 3

One surface of an electrodeposited copper foil was plated with fine roughening particles of copper under the same conditions of each of Examples 5, 9, and 14. The results were treated directly for stainproof or by a silane coupling agent without providing smoothening layers. The results were designated as Comparative Examples 1, 2, and 3.

Evaluation 1. Particle Shedding Property

The copper foil prepared in each of Examples 1 to 14 and Comparative Examples 1 to 3 was placed on a flat table with the blackened surface facing up. Filter paper moistened by water (Toyo Filter Paper No. 2) was laid on top, then a weight (250 g cylinder with bottom diameter of 15 mm) was placed on top. The filter paper was moved 15 cm, then any deposition of copper particles on the filter paper was examined. No particle shedding could be found for any of the examples of the invention.

As opposed to this, particle shedding was observed for Comparative Examples 1, 2, and 3.

Evaluation 2. Shielding Property 1

The electromagnetic shielding copper foil of each of Examples 1 to 14 was bonded to a polyethylene terephthalate film (thickness 75 μm). The bonding was performed by coating a polyester-based adhesive including a cross-linking agent on the surface of the copper foil. Next, a heat curing type ink was used to print a grid pattern of a grid width of 20 µm and a mesh size of 150 µm×150 µm on the copper foil by screen printing. The ink was cured by heating at 90° C. for 5 minutes, then the parts of the metal layer not protected by the ink were removed by a ferric chloride aqueous solution, then the ink was removed by a solvent. In this way, a laminate forming an electromagnetic shield with an aperture rate of 75% was prepared. The average transmittance of visible light of this laminate was measured and found to be at least 67%. The sheet resistance was measured, whereupon it was found to be at least 0.11 Ω/□. That is, it was possible to obtain a superior electromagnetic shield.

Evaluation 3. Shielding Property 2

An antireflection was formed by coating a fluororesin on a polyethylene terephthalate film (thickness 100 µm). The high-frequency electromagnetic shielding copper foil of each of Examples 1 to 14 was laminated by an acrylic-based adhesive on the surface of such a film not coated with the fluororesin. Next, an alkali developing type photoresist was coated on the copper foil by roll coating, prebaked, then exposed and developed using a photomask to provide a grid pattern of a grid width of 25 µm and a mesh size of 125 µm×125 µm. The parts of the metal layer not protected by the resist were etched by a ferric chloride solution, then the resist was removed in an alkali solution. As a result, it was possible to prepare a laminate having an aperture rate of at least 69%. The average transmittance of visible light of this laminate was measured and found to be at least 65%. The sheet resistance was measured, whereupon it was found to be at least 0.07 Ω/□. That is, it was possible to obtain a superior electromagnetic shield.

The aperture rate of the light transmitting parts when using the copper foil for electromagnetic shielding in the above way is preferably at least 70%. Equilateral triangle, square, equilateral hexagon, circle, or diamond shaped apertures having a side or diameter of 200 µm were uniformly etched in-plane in the electromagnetic shielding copper foil prepared in each example as light transmitting parts, whereupon it was found to be possible to etch an aperture rate of at least 70%.

Further, the actual sheet resistance of each of the copper foils having the thus formed light transmitting parts was measured, whereupon it was found to be between 0.01 Ω/□ and 0.3 Ω/□. That is, it was possible to obtain a sufficient electromagnetic shielding ability.

Evaluation 4. Uneven Color

The hue of the surface and the evenness of color of the black surface were evaluated visually for each example. In each case, the hue of the foil surface was found to be uniform and no uneven color could be found.

In Examples 1 to 4, arsenic was used for the plating bath for forming the fine particle roughening layers. In recent years, however, use of electroforming solutions utilizing toxic substances such as arsenic have come to be considered problems due to the environmental impact. Therefore, in Examples 5 to 14, the fine roughening particle layers were formed without using electroplating solutions liable to impact the environment due to inclusion of arsenic etc. In this way, the electromagnetic shielding copper foil of the present invention can be produced by an environmentally friendly method of production not using any toxic substances in the composition of the electroplating solution.

The electromagnetic shielding copper foil of the present invention is superior in electromagnetic shielding ability, high in transmittance, uniform in hue with no uneven color, and free of particle shedding. Further, by using this copper foil, it is possible to provide an excellent electromagnetic shield able to be used for a PDP etc.

While the invention has been described with reference to specific embodiments chosen for purpose of illustration, it should be apparent that numerous modifications could be made thereto by those skilled in the art without departing from the basic concept and scope of the invention.

What is claimed is:

1. An electromagnetic shielding copper foil comprising:
a copper foil or a copper alloy foil on at least one surface of which a fine roughening particle layer comprising fine roughening particles is provided,
wherein said fine roughening particle layer consists of:
a first fine roughening particle layer consisting of fine roughening particles from one of the group of metals of copper, a copper-cobalt alloy, a cobalt-nickel alloy and a copper-cobalt-nickel alloy, on which a second fine roughening particle layer comprising a fine roughening particles of a copper alloy is stacked.

2. An electromagnetic shielding copper foil comprising:
a copper foil or a copper alloy foil on at least one surface of which a fine roughening particle layer comprising fine roughening particles is provided,
wherein said fine roughening particle layer comprises
a first fine roughening particle layer comprising fine roughening particles of one of the group of metals of copper, a copper-cobalt alloy, a cobalt-nickel alloy and a copper-cobalt-nickel alloy, on which a second fine roughening particle layer comprising a fine roughening particles of a copper alloy is stacked; and
wherein said second fine roughening particle layer comprises a copper alloy containing at least one of selenium, antimony, tungsten, tellurium, bismuth, molybdenum and iron.

3. An electromagnetic shielding copper foil as set forth in one of claims 1 to 2, wherein said copper foil or said copper alloy foil comprises granular crystallizations and the surface roughness Rz of the surface of said copper foil or said copper alloy foil is not more than than 3 µm.

4. An electromagnetic shielding copper foil as set forth in any one of claims 1 to 2, wherein said fine roughening particle layer is treated for stainproof.

5. An electromagnetic shielding copper foil as set forth in any one of claims 1 to 2, wherein said fine roughening particle layer is treated by a silane coupling agent.

6. An electromagnetic shield produced by an electromagnetic shielding copper foil as set forth in any one of claims 1 to 2.

7. An electromagnetic shield produced by an electromagnetic shielding copper foil as set forth in claim 3.

8. An electromagnetic shield produced by an electromagnetic shielding copper foil as set forth in claim 4.

9. An electromagnetic shield produced by an electromagnetic shielding copper foil as set forth in claim 5.

10. An electromagnetic shield copper foil as set forth in claim 1 further comprising light transmitting parts, wherein the light transmitting parts comprise apertures uniformly arrayed on the electromagnetic shielding copper foil.

11. An electromagnetic shield copper foil as set forth in claim 10, wherein the light transmitting parts have an aperture rate of 60% to 97%.

12. An electromagnetic shielding copper foil as set forth in claim 1, wherein the first fine roughening particle layer comprises fine roughening particles of one of the group of metals of a copper-cobalt alloy, a cobalt-nickel alloy and a copper-cobalt-nickel alloy.

* * * * *